United States Patent
Chen et al.

(10) Patent No.: US 7,120,855 B2
(45) Date of Patent: Oct. 10, 2006

(54) SURVIVOR PATH MEMORY CIRCUIT AND VITERBI DECODER WITH THE SAME

(75) Inventors: Hong-Ching Chen, Feng Shan (TW); Wen-Zen Shen, deceased, late of Hsin Chu (TW); by Der-Tsuey Shen Wang, legal representative, Hsin Chu (TW)

(73) Assignee: MediaTek Inc., Hsin Chu (TW)

( * ) Notice: Subject to any disclaimer, the term of this patent is extended or adjusted under 35 U.S.C. 154(b) by 532 days.

(21) Appl. No.: 10/421,768

(22) Filed: Apr. 24, 2003

(65) Prior Publication Data

US 2003/0212950 A1 Nov. 13, 2003

(30) Foreign Application Priority Data

May 7, 2002 (TW) ................................ 91109538 A (51) Int. Cl.
*H03M 13/41* (2006.01)
(52) U.S. Cl. ..................................................... 714/795
(58) Field of Classification Search ................. 714/795
See application file for complete search history.

(56) References Cited

U.S. PATENT DOCUMENTS

| | | | | |
|---|---|---|---|---|
| 4,612,659 A | * | 9/1986 | Starke | ........................ 377/72 |
| 4,630,295 A | * | 12/1986 | Kamuro et al. | ................ 377/81 |
| 5,799,046 A | * | 8/1998 | Hayashi | ....................... 375/341 |
| 6,111,835 A | * | 8/2000 | Honma | ..................... 369/59.13 |
| 6,532,337 B1 | * | 3/2003 | Yoshinaka | ................... 386/116 |
| 2002/0094057 A1 | * | 7/2002 | Shibuya | ........................ 377/67 |
| 2002/0174402 A1 | * | 11/2002 | Yamamoto | ................... 714/795 |

* cited by examiner

*Primary Examiner*—Stephen M. Baker
(74) *Attorney, Agent, or Firm*—Birch, Stewart, Kolasch & Birch, LLP.

(57) ABSTRACT

A survivor path memory circuit and a Viterbi decoder with the circuit for saving the memory amounts. The Viterbi decoder includes a branch metric generator, an ACS (Add-Compare-Select) unit, a survivor path memory circuit and a decoding unit. The survivor path memory circuit includes survivor paths and decision bit paths. Each survivor path has multiplexers connected in series and each multiplexer outputs the selected data to next multiplexer and to another multiplexers of another survivor paths. Each decision bit path has register node connected in series, receives a decision bit signal generated from the ACS unit, and outputs delayed signal to the multiplexers of the corresponding survivor path. The data flow direction for the survivor paths is opposite to the data flow direction for the decision bit paths. Because the registers in the survivor paths are replaced by the registers in the decision bit paths, the survivor path memory circuit uses less memory, if the number of the decision bit paths is smaller than the number of the survivor paths.

8 Claims, 8 Drawing Sheets

SURVIVOR PATH MEMORY CIRCUIT AND VITERBI DECODER WITH THE SAME

BACKGROUND OF THE INVENTION

1. Field of the Invention

The invention relates to a survivor path memory circuit, and more particularly to a survivor path memory circuit used in a Viterbi decoder, in which the registers of survivor paths are replaced with the registers of decision bit paths so that the memory requirement for the survivor path memory circuit is reduced.

2. Description of the Related Art

A PRML (Partial Response Maximum Likelihood) system is used to retrieve EFM (Eight-to-Fourteen Modulation) signals from CD (Compact Disc)/DVD (Digital Versatile Disk). In the PRML system, a Viterbi decoder is usually used to realize the maximum likelihood detection.

Figure 1:
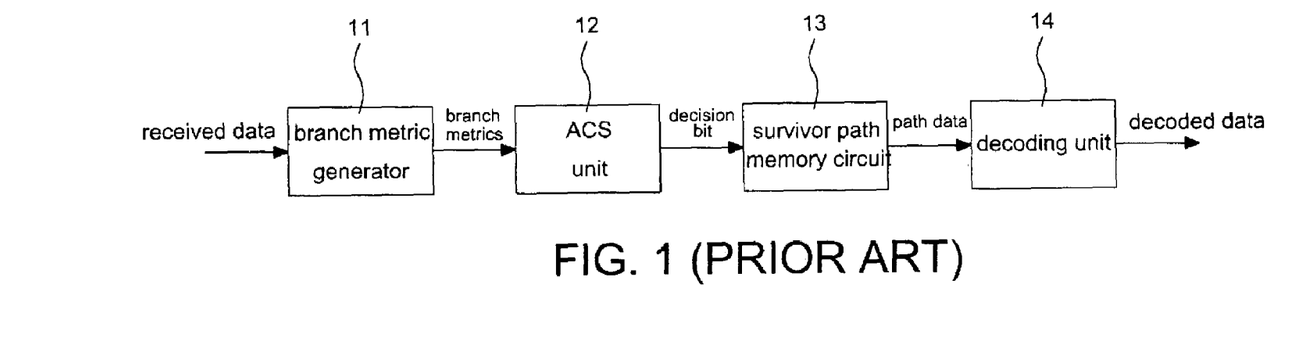
FIG. 1 is a block diagram showing a conventional Viterbi decoder.
}

FIG. 1 is a block diagram showing a conventional Viterbi decoder. Referring to FIG. 1, the Viterbi decoder includes a branch metric generator 11, an add-compare-select (ACS) unit 12, a survivor path memory circuit 13, and a decoding unit 14. The branch metric generator 11 calculates the branch metrics corresponding to each branch according to the received data, and outputs branch metrics to the ACS unit 12. The branch metric generator 11 calculates the distance, such as mean-square-distance, between the received data and the estimated data of the branch. For each state, the ACS unit 12 adds the branch metrics with the related state metrics to generate the candidate state metrics, compares and selects the minimum candidate state metric as the new state metric. The decision bit of the ACS unit 12, indicating the decision result of the state-metric selection, is sent to the survivor path memory circuit 13. According to the decision bit, the survivor paths of the survivor path memory circuit 13 are updating to keep consistent with the selected result of related state metrics. The survivor memory circuit 13 restores the decoded results corresponding to each state, and the decoding unit 14 executes the majority vote for the ending bits of all survivor paths to decide the decoded result.

Figure 2:
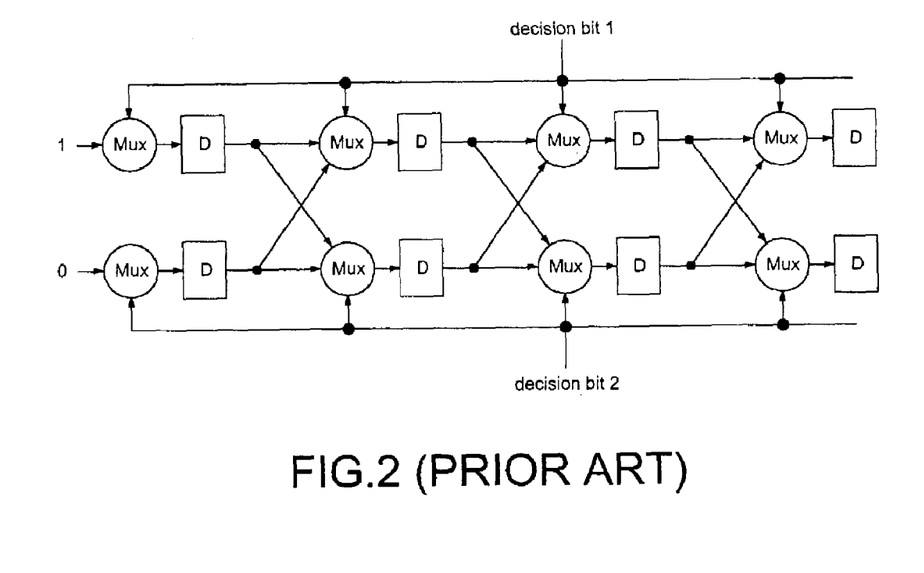
FIG. 2 is a data flow chart showing a survivor path memory circuit of a conventional two-state trellis diagram.

FIG. 2 is a data flow chart (DFC) of a conventional two-state trellis diagram for a survivor path memory circuit. As shown in FIG. 2, a plurality of registers D are employed to store the output value generated from the multiplexers Mux and output data to the multiplexers of next stage. Each decision bit of the ACS unit 12 is simultaneously connected to all the multiplexers of a set of survivor path in order to select the multiplexer's signal.

Figure 3:
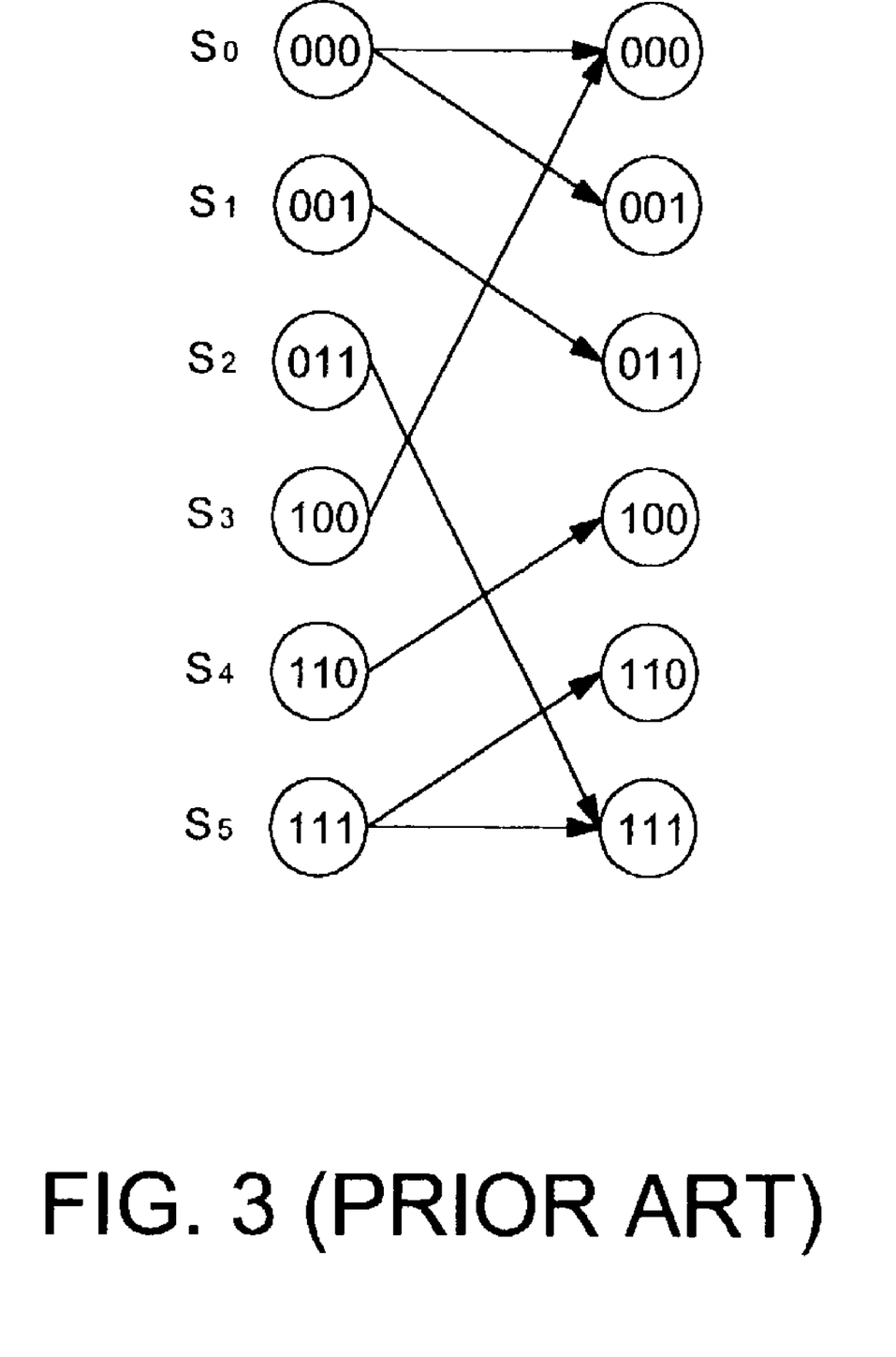
FIG. 3 is a simplified trellis diagram used to decoding the EFM signals according to the RLL of the EFM signals.

In the CD/DVD application, the recording signal with EFM/EFM+modulation, called the EFM signal, has the property of run length limited (RLL) that the minimum run length of an EFM signal is 3T, where T is a recording unit length. According to the RLL of the EFM signal, a simplified trellis diagram is obtained to build a PRML system for decoding the EFM signal, as shown in FIG. 3. The trellis diagram in FIG. 3 has six states, including state $S_0$(000), state $S_1$(001), state $S_2$(011), state $S_3$(100), state $S_4$(110), and state $S_5$(111). The states of (010) and (101) are invalid and not listed due to the minimum run length of 3T. In addition, state $S_1$(001), state $S_2$(011), state $S_3$(100) and state $S_4$(110) only have a branch.

Figure 4:
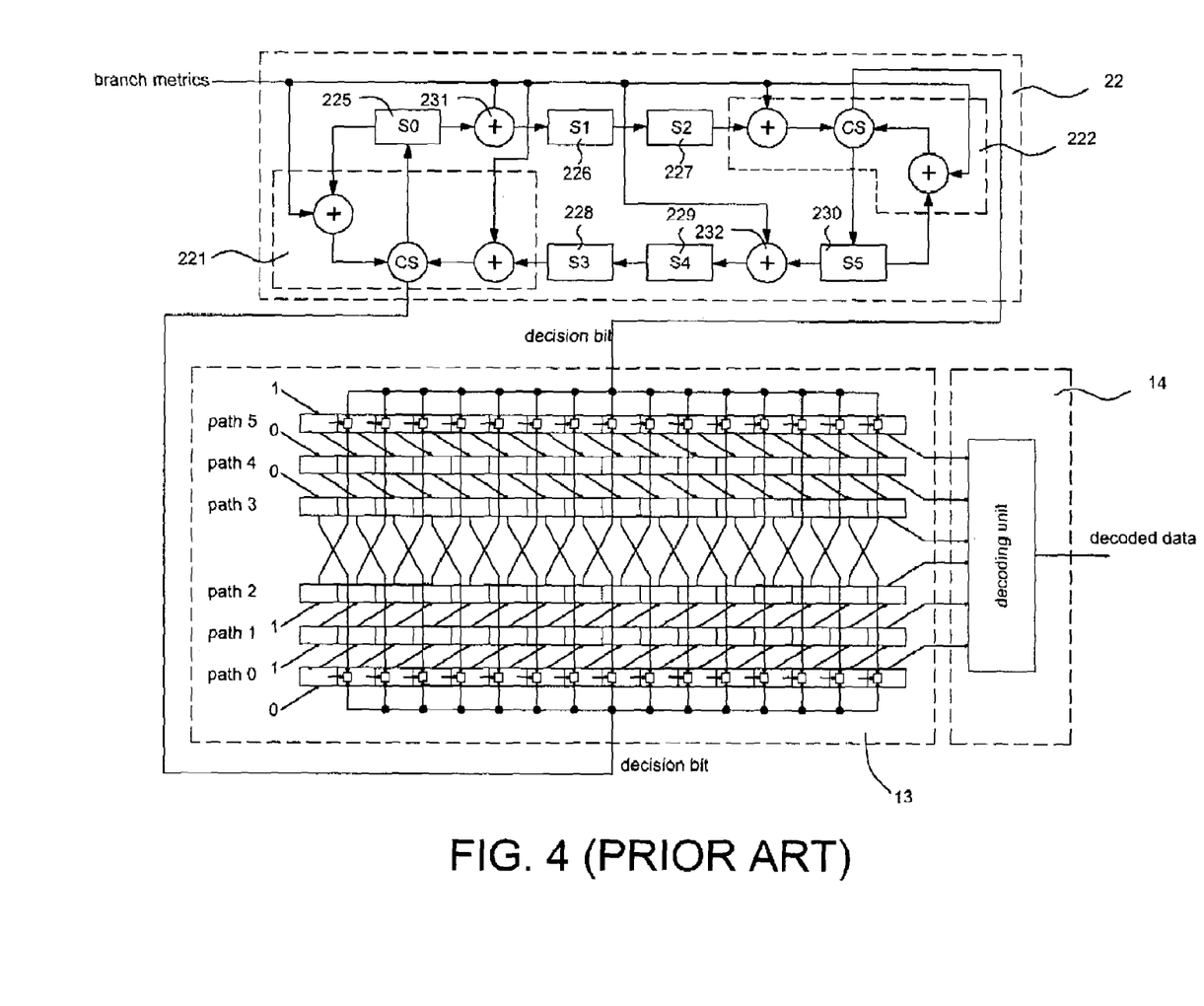
FIG. 4 is a block diagram showing a part of the Viterbi decoder applied to the trellis diagram of FIG. 3.

FIG. 4 is a block diagram showing a part of the Viterbi decoder using the trellis diagram of FIG. 3. Referring to FIG. 4, the Viterbi decoder includes an ACS unit 22, a survivor path memory circuit 13, and a decoding unit 14. Since the trellis diagram has been simplified, the ACS unit 22 only includes two ACS processors 221 and 222, two adders 231, 232, and six registers 225 to 230. Also, since the trellis diagram has been simplified, only the survivor paths 0 and 5 in the survivor path memory circuit 13 include multiplexers, and data from other survivor paths 1 to 4 are just delayed by the registers and then transferred to another survivor path memory or multiplexers. Each stage of the survivor path memory circuit 13 related to one decoding cycle contains six registers to store the output values generated from the multiplexers in the survivor path memory circuit 13, in which the number of register equals to the number of the state in the trellis, where a decoding cycle means that the Viterbi decoder decodes 1 bit data. The decoding unit 14 utilizes a majority vote circuit to vote, among the data output from the six paths, the majority data as the decoded data.

Figure 5:
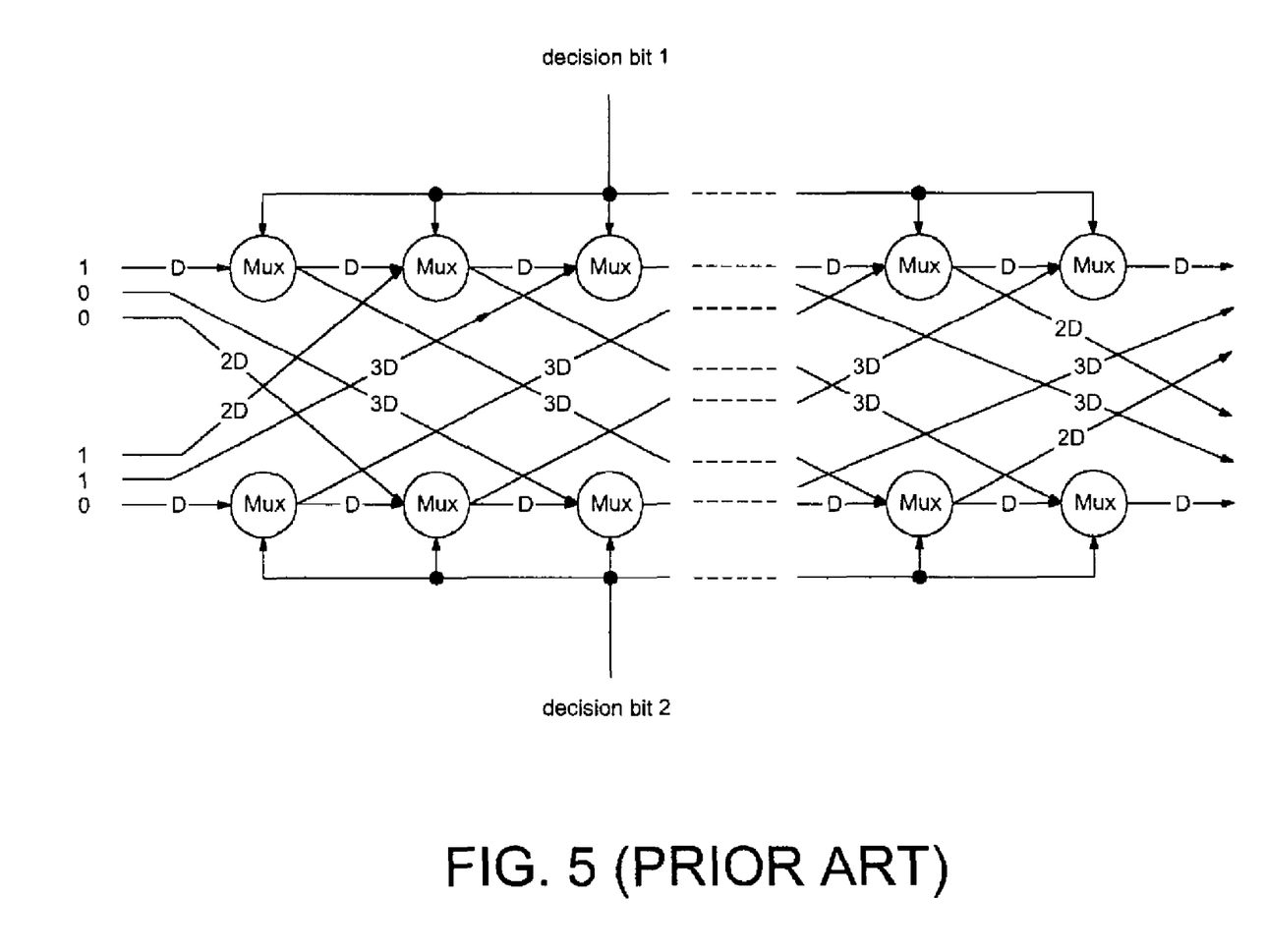
FIG. 5 is a data flow chart showing the survivor path memory circuit of FIG. 4.

FIG. 5 is a data flow chart showing the survivor path memory circuit of FIG. 4, where a node means an operation and an edge means a connection with the delay latency labeled on it. As shown in FIG. 5, the survivor path memory circuit includes a plurality of multiplexers Mux and registers (path memory) D, 2D and 3D, wherein each of the registers D represents a register that is delayed by one decoding cycle (stage), each of the registers 2D represents a register that is delayed by two decoding cycles, and each of the registers 3D represents a register that is delayed by three decoding cycles. The two decision bits output from ACS unit 22 are inputted to the multiplexers of two sets of survivor paths of the survivor path memory circuit 13, respectively.

Since a memory is utilized to store data in each path within each cycle and the multiplexer in each path receives the same decision bit signal, the memory usage in each path may be effectively reduced if the timing of the selection signal for the multiplexers can be rearranged.

SUMMARY OF THE INVENTION

In view of the above-mentioned problems, an object of the invention is to provide a survivor path memory circuit, which can reduce the required memory amounts by changing the timing of the selection signal of the multiplexer, while keeping the input/output characteristics the same.

To achieve the above-mentioned object, the invention provides a survivor path memory circuit including a plurality of survivor paths and a plurality of decision bit paths. Each survivor path includes a plurality of multiplexers connected in series, each having at least two input terminals, a selection terminal and an output terminal. The output terminal of one multiplexer is connected to one of the input terminal of next multiplexer in a survivor path, and also is connected to the input terminals of other multiplexers in other survivor paths. The decision bit paths respectively receive the plurality of decision bit signals, delay the decision bit signals by different time via a plurality of register nodes, and output the signals of each of the register nodes to the selection terminals of corresponding multiplexers in each survivor path. The data flows of the survivor paths and the decision bit paths are in opposite directions.

Due to the registers in the survivor paths having been replaced by the registers in the decision bit paths, the survivor path memory circuit uses less memory, if the decision bit paths are less than the survivor paths.

DETAILED DESCRIPTION OF THE INVENTION

The survivor path memory circuit and Viterbi decoder using the same of the invention will be described with reference to the accompanying drawings. In a typical survivor path memory circuit, the multiplexers in each memory path receive the same decision bit signal and the registers in each memory path are used to store data at each cycle. If the timing of the selection signal for the multiplexers (i.e., timing input to the multiplexers of the decision bit) is rearranged, the memory amounts (registers) in each path can be reduced.

Figure 6:
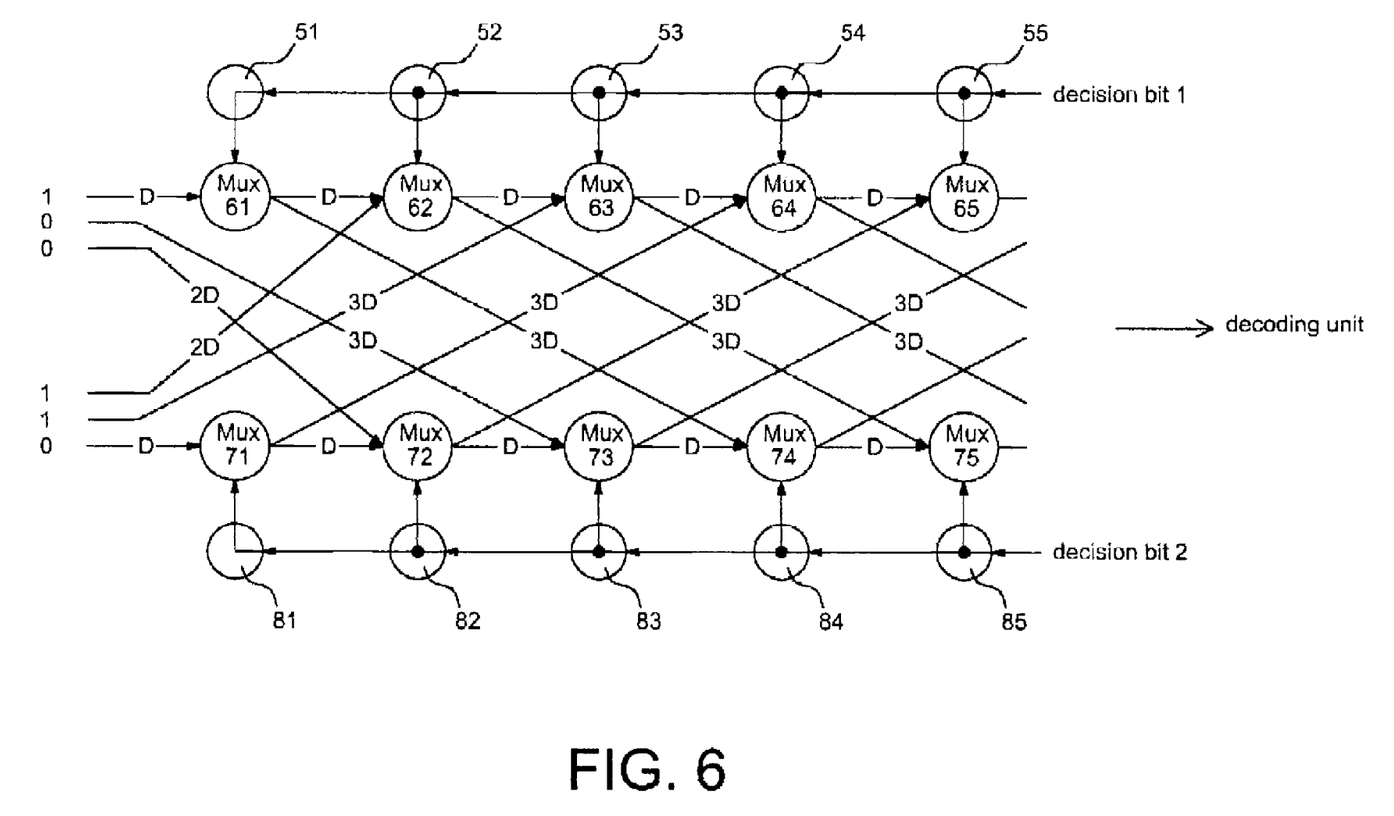
FIG. 6 is a data flow chart of a survivor path memory circuit, which the decision bit signals are inputted to the multiplexer through directed-connected nodes.

FIG. 6 shows a data flow chart, in which the decision bit signals are inputted to the multiplexer through directed-connected nodes. In the survivor path memory circuit as shown in FIG. 6, the decision bit signals are inputted to the multiplexers 61 to 65 of the first survivor path and the multiplexers 71 to 75 of the second survivor path through the first decision bit nodes 55 to 51 and second decision bit nodes 85 to 81, respectively, in which the input and output of decision bit nodes are connected directly. The data flow direction of the survivor paths is purposely plotted to be different from the data flow direction of the decision bit signals for the following reduction. Since the decision bit nodes 51 to 55 and 81 to 85 are connected directly to its adjacent nodes, the connections in the survivor path memory circuit are substantially the same as those of FIG. 5. Since the decision bit signals are inputted to the multiplexers 61 to 65 and 71 to 75 through the decision bit nodes 55 to 51 and 85 to 81, the survivor path memory circuit is divided into a plurality of stage positions according to the positions of the multiplexers and nodes.

Figure 7:
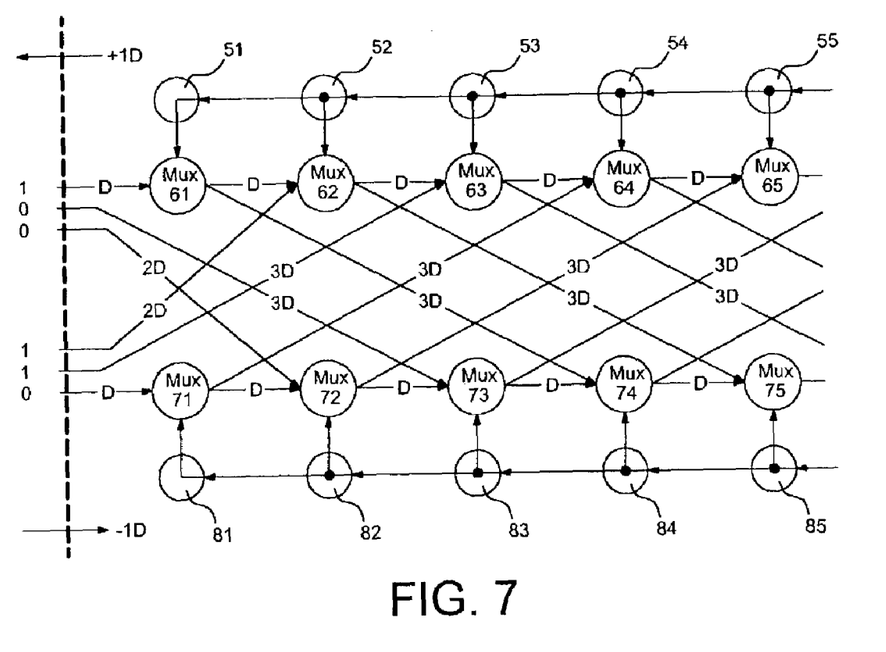
FIG. 7 is a data flow chart showing the survivor path memory circuit when the time reference line is located at the input terminal.
Figure 8:
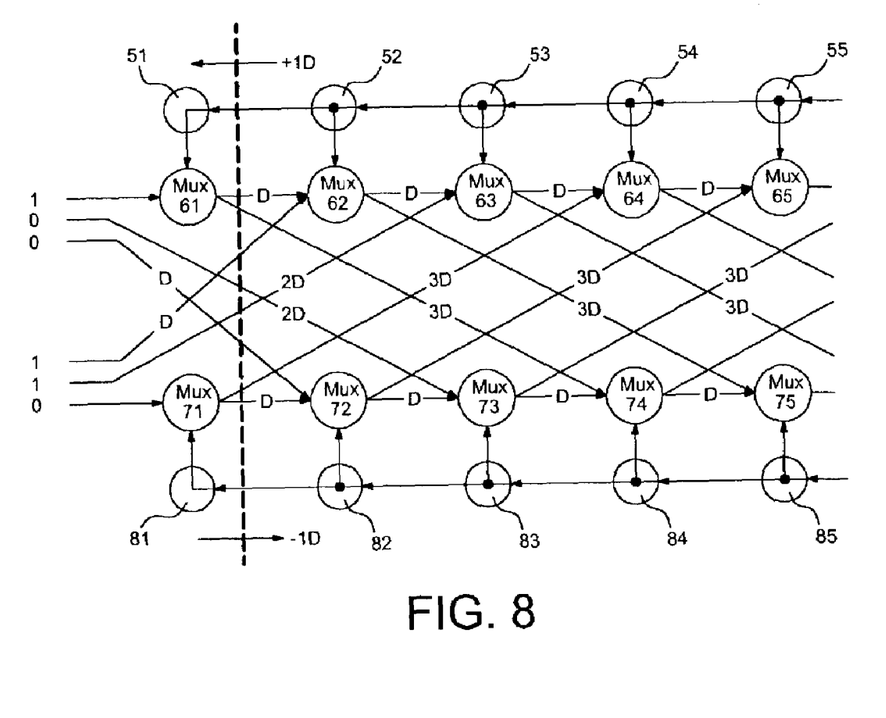
FIG. 8 is a data flow chart showing the survivor path memory circuit when the time reference line is shifted a latency of one cycle toward the right-hand side.
Figure 9:
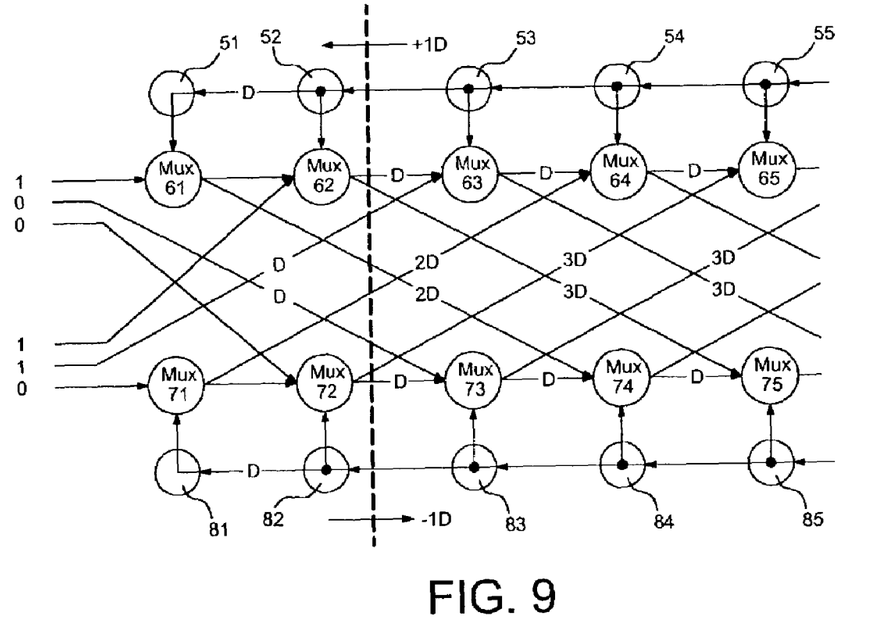
FIG. 9 is a data flow chart showing the survivor path memory circuit when the time reference line of FIG. 8 is shifted a latency of one cycle toward the right-hand side.

FIGS. 7, 8 and 9 show the data flow charts of the survivor path memory circuit, in which the vertical dashed lines illustrate the time reference. As shown in FIG. 7, the time reference line, shown as a dash line, is located at the input point of the memory paths. In this case, the input/output characteristics of the circuit are the same as that of FIG. 6. The design principle of the survivor path memory circuit of the present invention will be described with reference to the latency shifts of the time reference line. If the time reference line is shifted toward the right-hand side (in the direction of the data flow of the survivor paths) and passed through a multiplexer (a stage position) (i.e., a cycle), it represents that the reference time corresponding to the shifted region is changed. Therefore, a delay time D has to be added to each decision bit path by adding a register, and a delay time D has to be subtracted from each survivor path by removing a register. That is, since the data flow direction of the decision bit signal inputted to the multiplexer is toward the left-hand side, a register has to be added to delay the time. In addition, since each of the survivor paths has a data flow direction toward the right-hand side, a register has to be removed to decrease a delay time D. As long as the time reference line is shifted toward the right-hand side, a register has to be added to each decision bit path, and a register has to be removed from each survivor path, shown in the arrows at top and bottom of the time reference line.

FIG. 8 shows the data flow chart of the survivor path memory circuit, in which the time reference line is shifted a cycle (stage) toward the right-hand side. As shown in FIG. 8, since the time reference line is shifted a cycle toward the data flow direction of the survivor path (right-hand side), a register has to be removed in each passed survivor path. For example, no register is required in the survivor paths having a 1D register; the 2D register in the survivor paths becomes a 1D register; and the 3D register in the survivor paths becomes a 2D register. Consequently, the input terminal 1 is directly connected to the multiplexer 61, the input terminal 0 is connected to the multiplexer 72 through a 1D register, and the input terminal 0 is connected to the multiplexer 73 through a 2D register; the input terminal 0 is directly connected to the multiplexer 71, the input terminal 1 is connected to the multiplexer 62 through a ID register, and the input terminal 1 is connected to the multiplexer 63 through a 2D register. As a result, six registers are removed from the survivor path memory circuit, as shown in FIGS. 7 and 8.

FIG. 9 shows the data flow chart of the survivor path memory circuit, in which the time reference line is shifted two cycles toward the right-hand side from the input point. As shown in FIG. 9, since the time reference line is shifted a further cycle toward the right-hand side than the time reference line in the FIG. 8, a register will be removed from each passed survivor path, and a register will be added to each passed decision bit path. Therefore, the output terminal of the multiplexer 61 is directly connected to the multiplexer 62, the input terminal 0 is directly connected to the multiplexer 72, and the input terminal 0 is connected to the multiplexer 73 through a 1D register; the output terminal of the multiplexer 71 is directly connected to the multiplexer 72, the input terminal 1 is directly connected to the multiplexer 62, and the input terminal 1 is connected to multiplexer 63 through a 1D register. Meanwhile, the node 52 is connected to the node 51 through a register D, and the node 82 is connected to the node 81 through a register D. Consequently, four registers will be removed from the survivor path memory circuit, as shown in FIG. 9.

Figure 10:
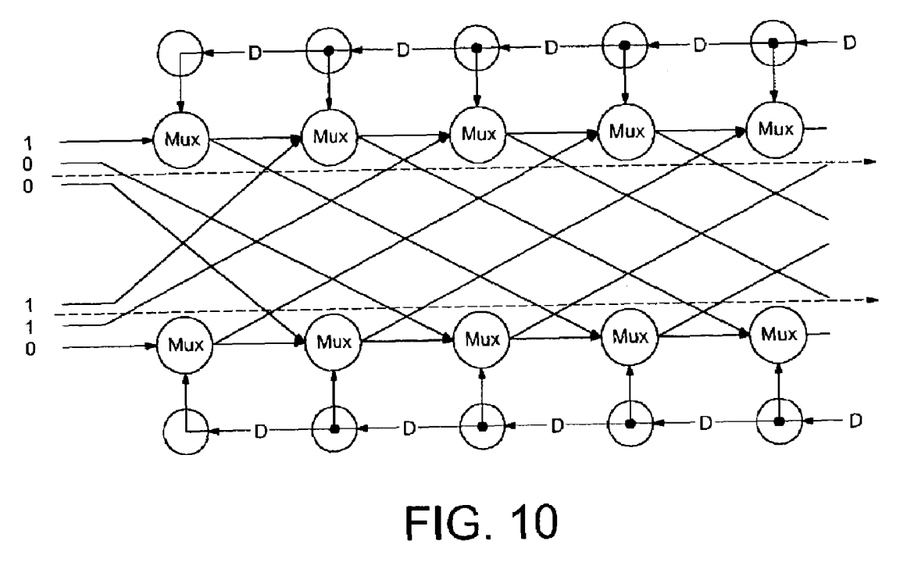
FIG. 10 shows a survivor path memory circuit according to an embodiment of the invention.

FIG. 10 shows a survivor path memory circuit according to an embodiment of the invention. As shown in FIG. 10, since the time reference line is passed through the survivor paths and decision bit paths in each stage position from right to left, a register is removed from each survivor path in each of the passed stage, and a register is added to each passed decision bit path. Hence, it is shown, from FIG. 10, that all registers in the survivor paths of the survivor path memory circuit have been removed, and registers have been added to the decision bit paths correspondingly. That is, the survivor path memory circuit moves the registers from the survivor paths to the decision bit paths and reduces the amounts of the registers, if the number of the decision bit paths is less than the number of the survivor paths. The reduction ratio depends on the numbers of the decision bit paths and the survivor paths. That is, as the number of the decision bit paths gets smaller than the number of the survivor paths, the reduction ratio of the memory usage gets larger. If the number of the decision bit paths equals to that of the survivor paths, the memory usage remains unchanged.

Figure 11:
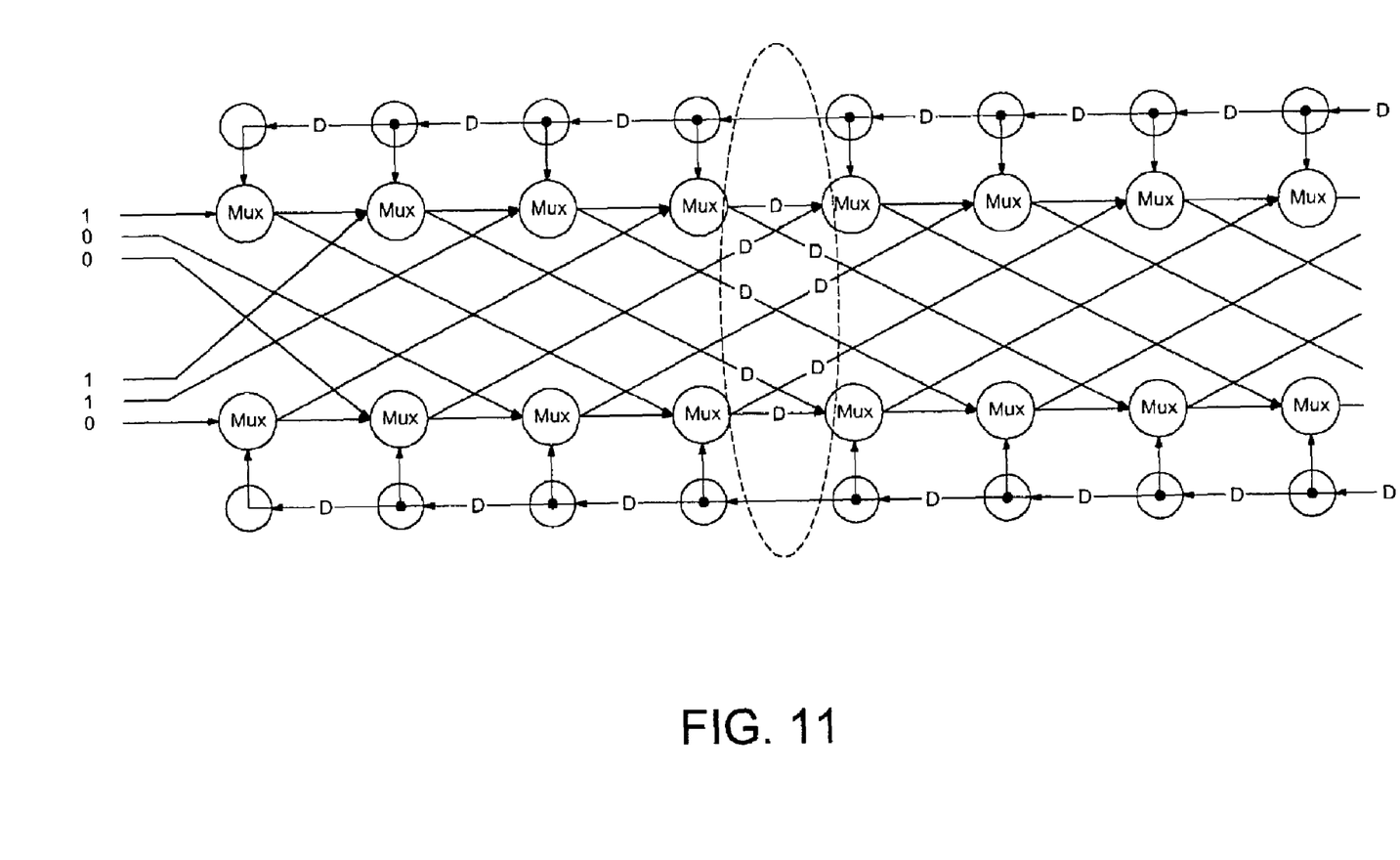
FIG. 11 shows a survivor path memory circuit according to another embodiment of the invention.

FIG. 11 shows a survivor path memory circuit according to another embodiment of the invention. In the first embodiment, no register is contained in each survivor path, shown as the dash lines in FIG. 10, so the signals at the input terminal have to be transferred from the input terminal to the output terminal through a plurality of multiplexers connected in series within one cycle time, in which the delay of the multiplexers may cause a critical delay of decoding. In this state, if the delay of survivor paths is too long, one cycle time is not enough to transfer the signal from the input terminal to the output terminal owing to the circuit delay. To solve the above problem, a register is added to each survivor path at proper positions in this embodiment, and registers are removed from the decision bit paths at the same positions, as shown in FIG. 11. For example, registers are kept at the positions of 1/2 length or 3/1 and 3/2 lengths in the survivor paths, dependent on the acceptable delay of operation. Hence, in this embodiment, the data needs not to be transferred from the input terminal to the output terminal within a cycle, but only needs to be transferred by partial (3/1 or 1/2) length.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. A survivor path memory circuit, which is used in a Viterbi decoder to receive decision bit signals and output decoded data according to the decision bit signals, the survivor path memory circuit comprising:
    a plurality of survivor paths, each having a plurality of multiplexers connected in series;
    each of the multiplexers having at least two input terminals, selection terminal and an output terminal, the output terminal of each multiplexer being connected to one of the input terminals of another multiplexer in a survivor path, and being connected to the input terminals of other multiplexers in other survivor paths; and
    a plurality of decision bit paths, each having a plurality of register nodes connected in series for receiving the decision bit signal, delaying the decision bit signals, and outputting the output signal of each register node to the corresponding multiplexer in the survivor paths;
    wherein the data flow direction of the survivor paths is opposite to the data flow direction of the decision bit paths.

2. The survivor path memory circuit according to claim 1, wherein the number of the decision bit paths is smaller than the number of the survivor paths.

3. The survivor path memory circuit according to claim 1, wherein a register is added at a predetermined position in each of the survivor paths and interconnecting paths, and the register at the predetermined position in each of the decision bit paths is removed.

4. The survivor path memory circuit according to claim 3, wherein the predetermined position is determined by the acceptable delay time of operation.

5. A Viterbi decoder, having a branch metric generator, an add-compare-select unit, a survivor memory circuit, and a decoding unit, the survivor memory circuit comprising:
    a plurality of survivor paths, each having a plurality of multiplexers connected in series;
    each of the multiplexers having at least two input terminals, selection terminal and an output terminal, the output terminal of each multiplexer being connected to one of the input terminals of another multiplexer in a survivor path, and being connected to the input terminals of other multiplexers in other survivor paths; and
    a plurality of decision bit paths, each having a plurality of register nodes connected in series for receiving the decision bit signal, delaying the decision bit signals, and outputting the output signal of each register node to the corresponding multiplexer in the survivor paths;
    wherein the data flow direction of the survivor paths is opposite to the data flow direction of the decision bit paths.

6. The Viterbi decoder according to claim 5, wherein a register is added at a predetermined position in each of the plurality of survivor paths and interconnecting paths, and the register at the predetermined position in each of the decision bit paths is removed.

7. The Viterbi decoder according to claim 6, wherein the predetermined position is determined by the acceptable delay time of operation.

8. The survivor path memory circuit according to claim 6, wherein the number of the decision bit paths is smaller than the number of the survivor paths.

* * * * *